(12) United States Patent
Mukoyama (10) Patent No.: US 6,400,519 B2
(45) Date of Patent: Jun. 4, 2002

(54) SPIN VALVE MAGNETORESISTIVE EFFECT TYPE ELEMENT ASSESSMENT METHOD AND A SPIN VALVE MAGNETORESISTIVE EFFECT TYPE ELEMENT ASSESSMENT DEVICE

(75) Inventor: Naoki Mukoyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/774,931

(22) Filed: Jan. 31, 2001

Related U.S. Application Data (63) Continuation of application No. PCT/JP99/00746, filed on Feb. 19, 1999.

(30) Foreign Application Priority Data

Sep. 18, 1998 (JP) .......................................... 10-264222

(51) Int. Cl.[7] ................................................. G11B 27/36
(52) U.S. Cl. ........................... 360/31; 360/75; 360/313; 324/212
(58) Field of Search ............................. 360/31, 55, 46, 360/75, 51, 77.02, 78.04, 313, 314, 324.1; 324/252, 212, 226; 338/32 R (56) References Cited

U.S. PATENT DOCUMENTS

| 5,650,887 | A | | 7/1997 | Dovek et al. | |
|---|---|---|---|---|---|
| 5,982,568 | A | * | 11/1999 | Yamamoto et al. | ............ 360/31 |
| 5,995,305 | A | * | 11/1999 | McNeil et al. | ................ 360/31 |
| 6,295,175 | B1 | * | 9/2001 | Tomita et al. | ................ 360/53 |

FOREIGN PATENT DOCUMENTS

| JP | 08-306017 | 11/1996 |
|---|---|---|
| JP | 10-228614 | 8/1998 |
| JP | 10-269537 | 10/1998 |

\* cited by examiner

Primary Examiner—Alan T. Faber
(74) Attorney, Agent, or Firm—Greer, Burns & Crain, Ltd.

(57) ABSTRACT

A spin valve magnetoresistive effect type element assessment device includes a head assaying device having a magnetic disk provided with an assaying track where magnetic information is recorded, an oscilloscope for receiving a reproducing signal from an SV head employing an SV element through an amplifier, and a PC for measuring a track profile, namely, data representing relative position dependency of an output from the SV head with respect to the assaying track by controlling the head assaying device and oscilloscope.

6 Claims, 9 Drawing Sheets

SPIN VALVE MAGNETORESISTIVE EFFECT TYPE ELEMENT ASSESSMENT METHOD AND A SPIN VALVE MAGNETORESISTIVE EFFECT TYPE ELEMENT ASSESSMENT DEVICE

This is a continuation of International Application No. PCT/JP99/00746, filed Feb. 19,1999, and not published in English.

TECHNICAL FIELD

The present invention relates to a spin valve magnetoresistive effect type element assessment method and a spin valve magnetoresistive effect type element assessment device for assaying the magnetization state in a pinned layer in a spin valve magnetoresistive effect type element.

BACKGROUND ART

A spin valve magnetoresistive effect type element or an element called a spin valve element has been known as an element for a magnetic sensor.

Figure 10:
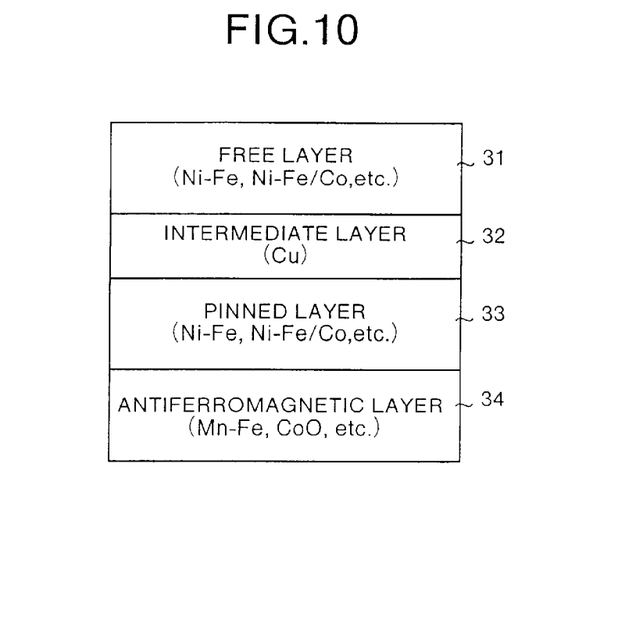
FIG. 10 is a schematic view explaining an arrangement of the spin valve magnetoresistive effect type element.

The spin valve magnetoresistive effect type element is an element comprising, as shown in FIG. 10, a free layer 31 made of a ferromagnetic material (Ni—Fe, etc.), an intermediate layer 32 made of a non-magnetic metal material (typically, Cu), a pinned layer 33 made of a ferromagnetic material (Ni—Fe, etc.), and an antiferromagnetic layer 34 made of an antiferromagnetic material (Mn—Fe).

The spin valve magnetoresistive effect type element (hereinafter, referred to as the SV element) is an element that detects an external magnetic field by exploiting the fact that the element resistance varies considerably with a difference between the direction of magnetization in the free layer 31 and that in the pinned layer 33, and used as a magnetic data reading element in an magnetic disk device, a magnetic tape device, a magnetic card reader, etc., for example.

The antiferromagnetic layer 34 in the SV element is a layer that prevents the direction of magnetization in the pinned layer 33 from being dependent on an external magnetic field (fixes the direction of magnetization to the initial direction). The intermediate layer 32 is a layer that weakens the exchange interaction between the free layer 31 and pinned layer 33, and made thinner than the correlation length of conduction electrons. The free layer 31 is a layer, in which the direction of magnetization is free to change in response to an external magnetic field, and typically subjected to heat treatment in the magnetic field so as to have an easy axis that is perpendicular to the direction of magnetization in the pinned layer 33.

Thus, the SV element detects a difference between the direction of magnetization in the free layer 31 and that in the pinned layer 33 caused by an external magnetic field as variance in resistance. Therefore, detectability of magnetic field is affected considerably by the magnetization state in the pinned layer 33. Also, because the magnetization state in the pinned layer 33 is fixed by the antiferromagnetic layer 34, if a temperature raises above the Néel temperature at a portion within the antiferromagnetic layer 34, there may occur inconveniences such that the detectability of magnetic field is degraded, or the SV element no longer functions as the magnetic field detecting element.

Figure 11:
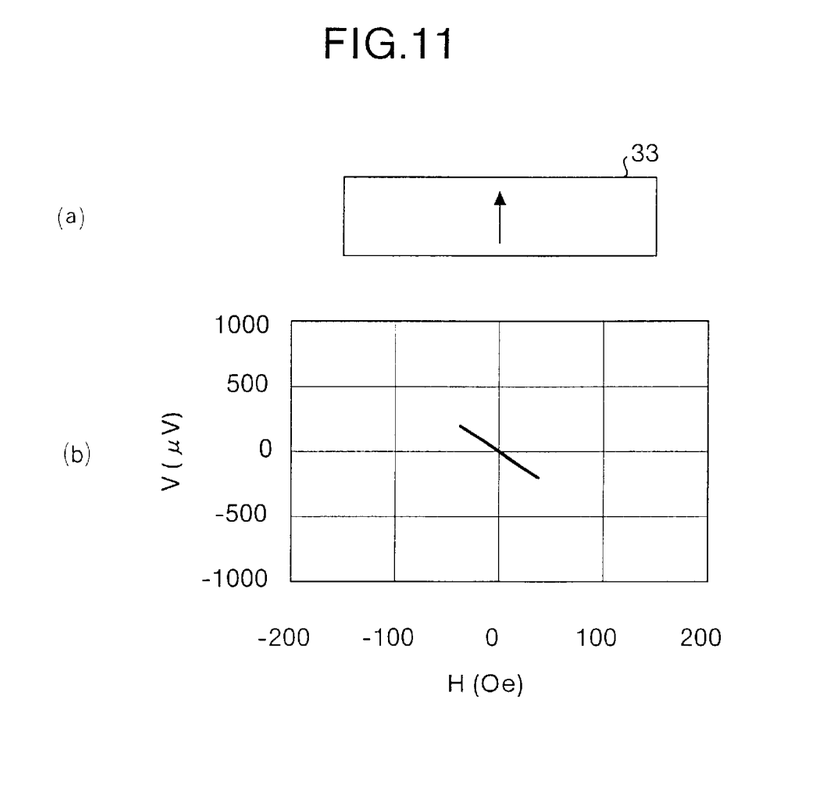
FIG. 11 is an explanatory view showing a correlation between a magnetization state in the pinned layer and magnetic field detecting characteristics of the spin valve magnetoresistive effect type element.
Figure 12:
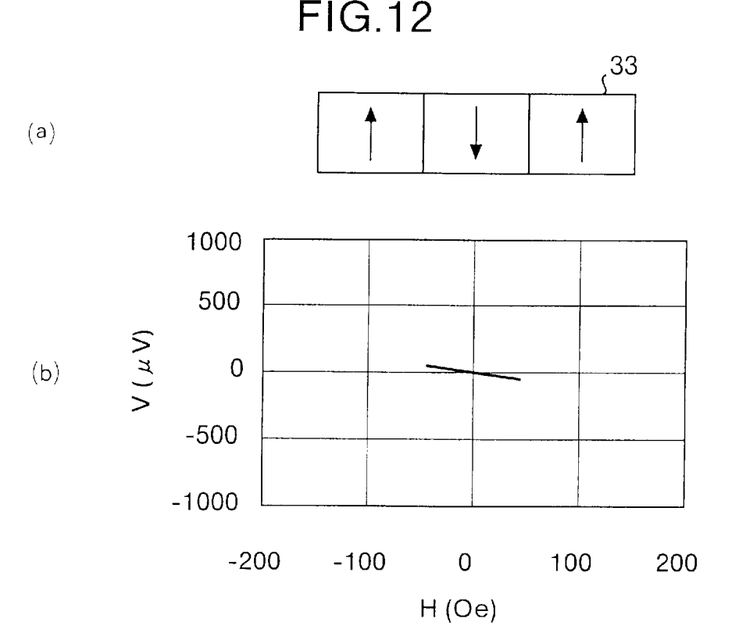
FIG. 12 is an explanatory view showing a correlation between a magnetization state in the pinned layer and magnetic field detecting characteristics of the spin valve magnetoresistive effect type element.
Figure 13:
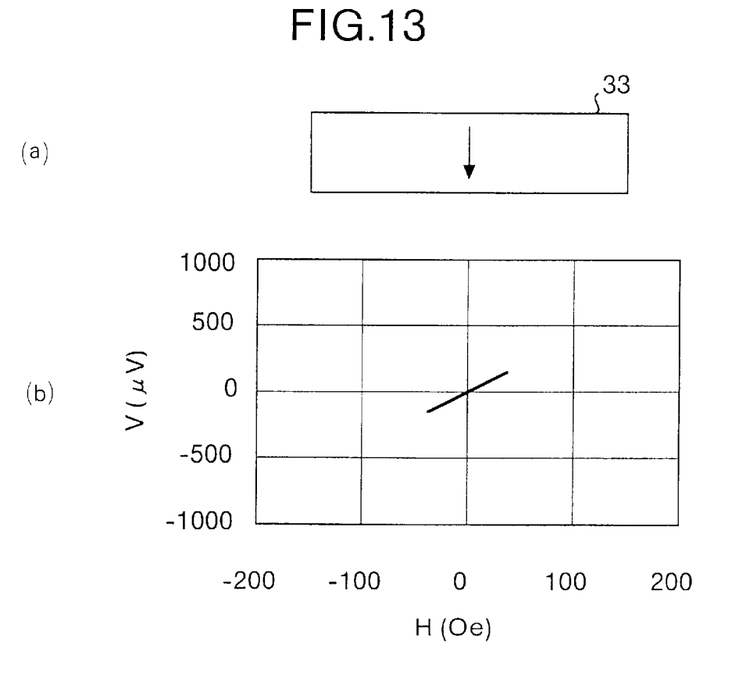
FIG. 13 is an explanatory view showing a correlation between a magnetization state in the pinned layer and magnetic field detecting characteristics of the spin valve magnetoresistive effect type element.

More specifically, given that the magnetization state in the pinned layer 33 and the ρ-H characteristics of the SV element immediately after the manufacturing are as those shown in FIGS. 11(a) and 11(b), respectively, if the magnetization state in the pinned layer 33 changes to the one as shown in FIG. 12(a) in a use, then the ρ-H characteristics may change correspondingly to the one as shown in FIG. 12(b). Further, if the direction of magnetization in the pinned layer 33 is completely inversed as shown in FIG. 13(a), then the ρ-H characteristics of the SV element may change correspondingly to the one as shown in FIG. 13(b).

As a preventive technique against such characteristics deterioration caused by a change of the magnetization state in the pinned layer 33, U.S. Pat. No. 5,650,887 discloses a magnetic disk device and a magnetic field sensor for, when the ρ-H characteristics of the SV element are deteriorated, providing the pinned layer with circumstances (magnetic field and temperature) capable of restoring the magnetization state to the initial state by allowing a current of a predetermined pattern to pass through.

According to the magnetic disk device disclosed in the above publication, deterioration of the ρ-H characteristics of the SV element provided in a magnetic head is detected by an increase in an error rate. Also, the magnetic field sensor detects deterioration of the ρ-H characteristics by a drop in an output from the sensor.

By using the aforementioned technique, it is possible to restore the characteristics of the SV element that have been deteriorated in response to a change of the magnetization state in the pinned layer. However, if the characteristics of the SV element are deficient from the start, it is impossible to upgrade such deficient characteristics to the standards. In other words, an SV element may be produced, in which the magnetization in the pinned layer 33 is not inversed, but the gradient of the ρ-H characteristics is smaller than a typical one.

Adapting the foregoing technique to such an SV element, however, cannot upgrade the characteristics of the SV element to the standards by means of current passing treatment. On the contrary, this causes a magnetic disk device or a magnetic field sensor to trigger the current passing treatment in response to a slight inversion of the magnetization (trigger the current passing treatment frequently). Also, incorporating a magnetic head employing such an SV element in a normal magnetic disk device could only result in a magnetic disk device with strong likelihood of becoming incapable of reading data.

The present invention is devised to solve the above problems, and therefore, has an object to provide a spin valve magnetoresistive effect type element assessment method and a spin valve magnetoresistive effect type element assayer, which can assessment the existence of an area in the pinned layer in the spin valve magnetoresistive effect type element where the magnetization has been inversed.

DISCLOSURE OF THE INVENTION

According to a spin valve magnetoresistive effect type element assessment method of the present invention, a resistance value of a spin valve magnetoresistive effect type element is measured while a relative location correlation between the spin valve magnetoresistive effect type element and a magnetic field having a predetermined intensity distribution is adjusted. Then, a magnetization state in a pinned layer in the spin valve magnetoresistive effect type element is assayed based on a correlation between the relative location correlation and resistance value obtained from measuring.

In other words, it is difficult to find directly the magnetization state (position, width, etc. of a portion where magnetization is inverted) in the pinned layer by the relative location correlation between the SV element and magnetic field and the correlation between the SV element and resistance value obtained from the foregoing measuring. However, it is easy to compute a correlation that would be measured by presuming the magnetization state in the pinned layer.

Hence, by measuring the relative location correlation between the SV element and magnetic field and the correlation between the SV element and resistance value like in the present invention, it is possible to presume the magnetization state and the width and position of a magnetization inverted area in the pinned layer from similarity with the correlation obtained by means of computation and the correlation obtained by means of measurement.

In addition, a spin valve magnetoresistive effect type element assessment device of the present invention is a device for assaying a magnetization state in a pinned layer in a spin valve magnetoresistive effect type element incorporated in a magnetic head, including: a magnetic disk having an assaying track, in which predetermined magnetic information is recorded; an actuator which maintains the magnetic head over the magnetic disk, the actuator also changes a distance between the magnetic head and a rotation center of the magnetic disk; and a position dependency data measuring and outputting unit which outputs position dependency data representing position dependency of a resistance value of the spin valve magnetoresistive effect type element by measuring the resistance value of the spin valve magnetoresistive effect type element while changing a position of the magnetic head in relation to the assaying track under control of the actuator.

According to the above spin valve magnetoresistive effect type element assayer, the SV element assessment method of the present invention can be adapted to an SV element incorporated in a magnetic head. In other words, because the magnetization state in the pinned layer in the SV element inside the magnetic head can be assayed, by using the present assayer, it becomes possible to judge, before the magnetic head is incorporated in a magnetic disk device, whether the magnetic head is normal or the magnetic head has normal characteristics due to heat treatment in the magnetic field, etc. Also, it becomes possible to effectively develop and conduct a study on a magnetic head that does not readily cause magnetization inversion in the pinned layer in the SV element and a magnetic disk device.

The position dependency data measuring and outputting unit is not limited to the type that measures the resistance value of the SV element per se, and can be of any type that measures a value equivalent to the resistance value. For example, it maybe a type that measures a current by applying a constant voltage to the SV element or a type that measures a voltage by supplying a constant current to the SV element. Also, an output form of the position dependency data can be a display on a display screen, print out on a sheet of paper, a formation of a file, etc.

When achieving the spin valve magnetoresistive effect type element assessment device of the present invention, the assaying track prepared on the magnetic disk can have any width. However, if it is arranged in such a manner that the assaying track is a track having a width narrower than a core width of the spin valve magnetoresistive effect type element subject to assaying, the spin valve magnetoresistive effect type element assessment device can be a device that outputs the position dependency data with which qualitative analysis is readily made. Magnetic information recorded in the assaying track is not especially limited. However, periodic magnetic information generally used in assaying the magnetic disk is preferable.

Also, when achieving the spin valve magnetoresistive effect type element assessment device of the present invention, a time variation data measuring and outputting unit which measures the resistance value of the spin valve magnetoresistive effect type element, and outputs time variation data representing time variation associated with measuring can be additionally provided. By preparing the assaying track where magnetic information that makes a dibit reproducing waveform obtainable is recorded on the magnetic disk when the time variation data measuring and outputting unit is additionally provided, in case that the magnetization is inverted in more than half the area in the pinned layer in the SV element, one can obtain time variance data that directly indicates the occurrence of the magnetization inversion.

BEST MODE FOR CARRYING OUT THE INVENTION

A preferred embodiment of a spin valve magnetoresistive effect type element assessment method and a spin valve magnetoresistive effect type element assessment device of the present invention is explained in detail below.

Figure 1:
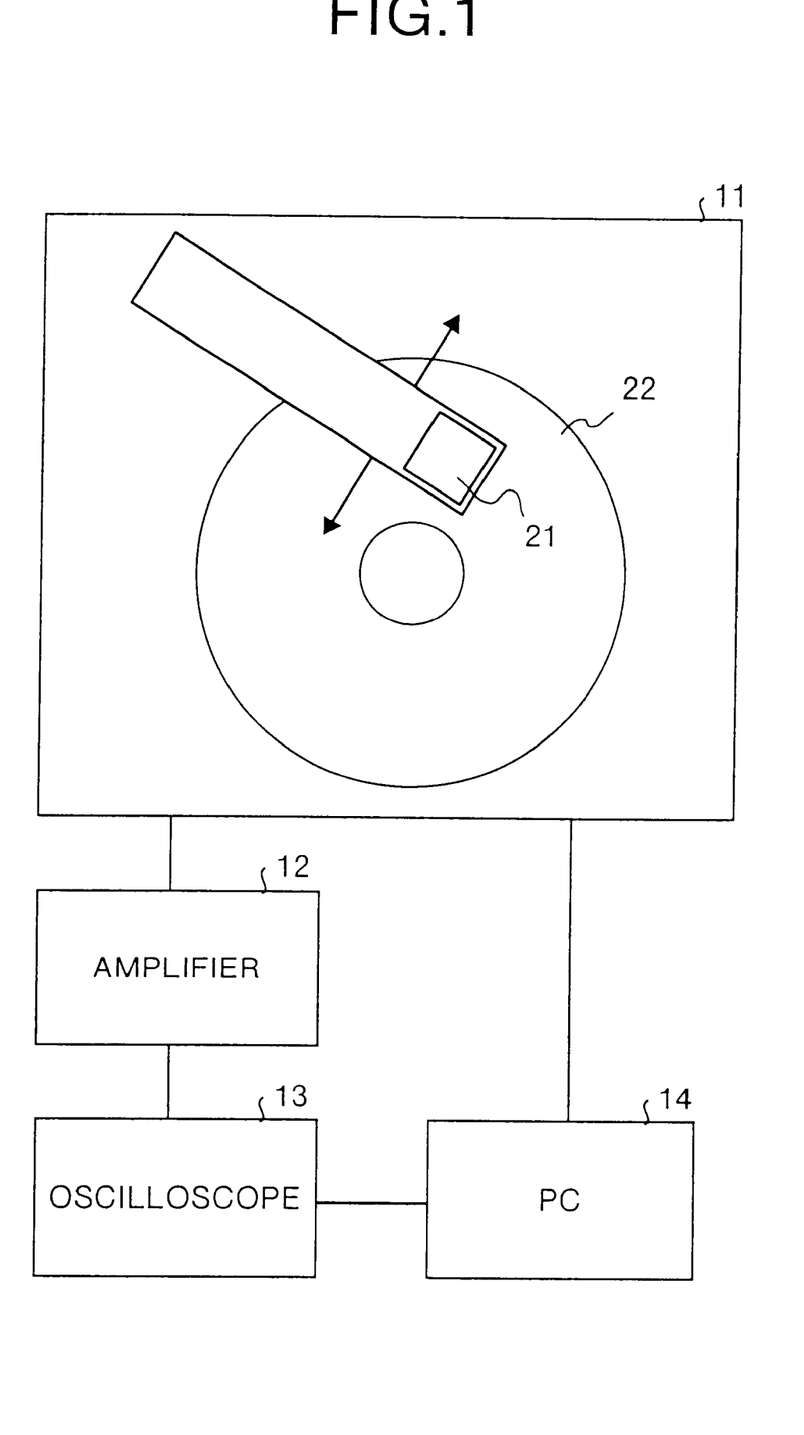
FIG. 1 is a block diagram schematically showing an arrangement of a spin valve magnetoresistive effect type element assessment device in accordance with one embodiment of the present invention.

FIG. 1 shows a schematic arrangement of a spin valve magnetoresistive effect type element assessment device in accordance with one embodiment of the present invention. The spin valve magnetoresistive effect type element assessment device (hereinafter, referred to as the SV element assayer) of the present embodiment is a device for assaying the state in a pinned layer in a spin valve magnetoresistive effect type element (hereinafter, referred to as the SV element) incorporated in a magnetic head for a fixed type magnetic disk device, and as shown in the drawing, comprises a head testing device 11, an amplifier 12, an oscilloscope 13, and a personal computer (PC) 14.

The head testing device 11 is one type of magnetic disk device arranged in such a manner that a magnetic head 21 (hereinafter, referred to as the SV head) provided with the SV element can be readily attached or replaced. The head testing device 11 is provided with a magnetic disk 22, in which information of a predetermined pattern is stored in more than one track. The amplifier 12 is a device that further amplifies an output from a reproducing amplifier (not shown), provided inside the head testing device 11, for outputting a voltage corresponding to a resistance of the SV element. An output from the amplifier 12 is inputted to the oscilloscope 13 also serving as a so-called transient memory under the control of the PC 14.

The PC 14 stores a program for controlling the head testing device 11 and oscilloscope 13 systematically, and the SV element assessment device measures a track profile, namely, the data enabling assaying of the magnetization state in the SV element inside the SV head 21.

The following description will describe more concretely an arrangement and an operation of the present SV element assayer. The magnetic disk 22 inside the head testing device 11 is a disk provided with two types of tracks: a plurality of tracks each having a different width at which magnetic information enabling observation of a dibit reproducing waveform is written; and tracks each having a different width at which magnetic information enabling observation of a solitary reproducing waveform is written.

In addition, measuring condition information, composed of measuring start position information $r_S$, measuring end position information $r_E$, and measuring interval information $\delta r$ for each track, is set (stored) in the PC 14. Although more specific use of each kind of information forming the measuring condition information will be described below, as to $r_S$ and $r_E$, values are set such that a deviation between each of $r_S$ and $r_E$ and a distance $r_C$ from the center of the magnetic disk 22 of the center line on the corresponding track, "$r_S$-$r_C$" and "$r_C$-$r_E$", is approximately as large as the core width of the SV element inside the SV head 21. Also, a value ranging from one-tenths to one-hundredths of "$r_S$-$r_E$" is set to $\delta r$.

When the SV head 21 (SV element) is assayed by the present assayer, the operator incorporates the SV head 21 subject to assaying in the head testing device 11, and inputs to the PC 14 a measuring start command including information specifying a track that should be used.

Upon receipt of the input of the start command, the PC 14 reads out the measuring condition information for the specified track. Then, the PC 14 starts to rotate the magnetic disk 22 by controlling the head testing device 11, while at the same time swinging the SV head 21 so that its center is placed over the circumference at a distance $r_S$ from the center of the magnetic disk 22.

Subsequently, the PC 14 makes the oscillator 13 measure a peak-to-peak amplitude of a reproducing output from the SV head 21 in the current state. Then, the PC 14 takes in the measured value and stores the same in a one-to-one correspondence with a measuring position, after which the PC 14 swings the SV head 21 toward the inner radius by $\delta r$, and obtains the peak-to-peak amplitude of the reproducing output from the swung SV head 21 by means of the oscilloscope 13.

The PC 14 repeats the foregoing control until the center of the SV head 21 is placed over a position at a distance $r_E$ from the center of the magnetic disk 22. Upon completion of the measurement at the distance $r_E$, the PC 14 displays on its own display screen a track profile, namely, a graph showing measuring position dependency of the peak-to-peak amplitude, based on a set of the peak-to-peak amplitudes stored therein in correspondence with their respective measuring positions.

Subsequently, the PC 14 swings the SV head 21 to a measuring position corresponding to each peak position in the track profile, and makes the oscilloscope 13 measure time variation (reproducing waveform) of a reproducing output from the SV head 21 in the current state.

Then, when the oscilloscope 13 completes the measurement of the reproducing waveform, the PC 14 takes in the measuring result and stores the same therein. Subsequently, the PC 14 controls the head testing device 11 to end the measurement, and upon input of a predetermined command from the operator, displays the reproducing waveform measured by the oscilloscope 13 on its own display screen.

The following description will describe more concretely an operation of the SV element assessment device (operation of the PC 14) by way of an example case where assaying is made by using a track, in which magnetic information enabling observation of a dibit reproducing waveform and which has a width narrower than the width of the SV element (width of the free layer) subject to assaying.

Figure 2:
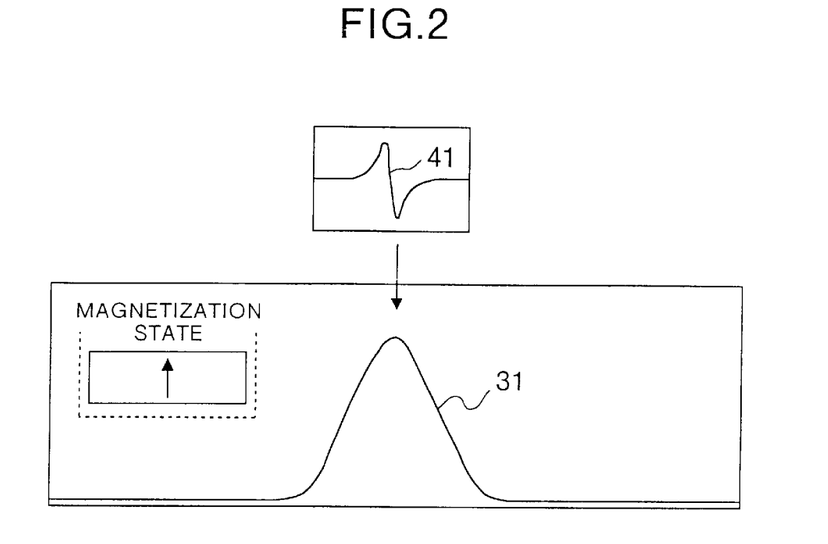
FIG. 2 is an explanatory view showing a track profile measured by the spin valve magnetoresistive effect type element assessment device according to the embodiment.

In this case, when the magnetization in the pinned layer in the SV element has not been inverted, a track profile 31 having a single peak as shown in FIG. 2 is displayed on the display screen of the PC 14. Also, the PC 14 measures a reproducing waveform 41 with its measuring position indicated by an arrow, and displays the same when directed so.

Figure 3:
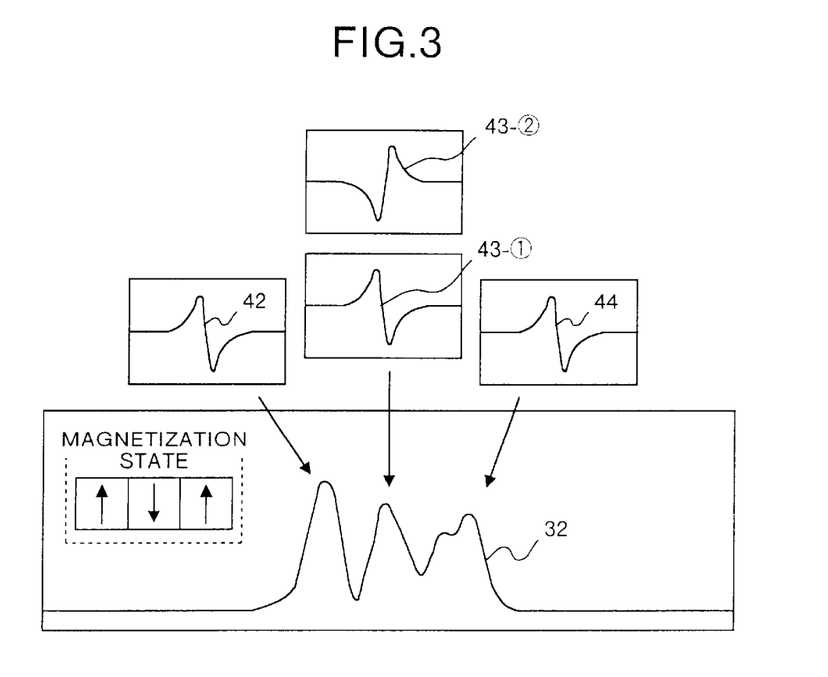
FIG. 3 is an explanatory view showing a track profile measured by the spin valve magnetoresistive effect type element assessment device according to the embodiment.
Figure 4:
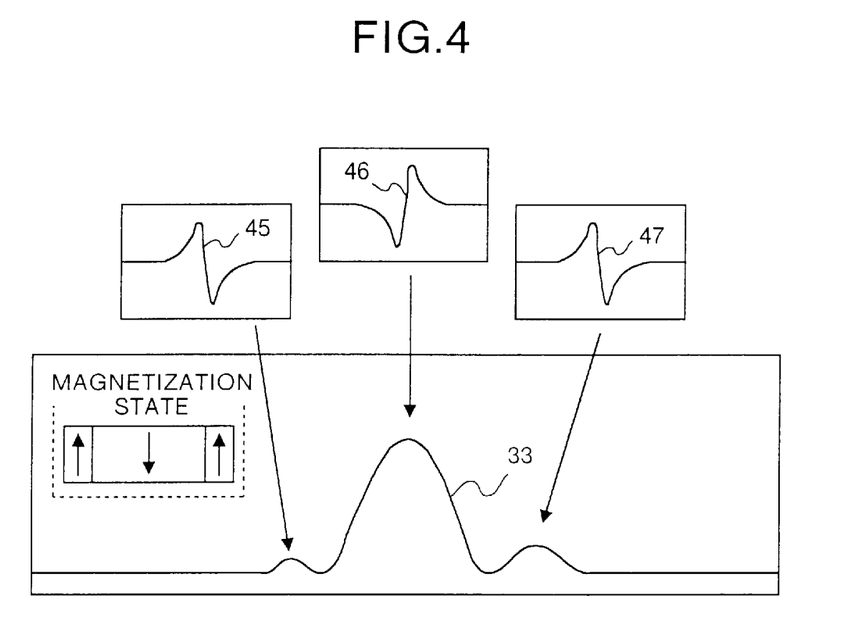
FIG. 4 is an explanatory view showing a track profile measured by the spin valve magnetoresistive effect type element assessment device according to the embodiment.

In contrast, when the pinned layer has an inverted magnetization area as wide as approximately one-third of the entire width (length in the core axis direction) at the center, the PC 14 displays a track profile 32 having three peaks as shown in FIG. 3.

In addition, as a reproducing waveform at each peak position, (1) when the width of the track used in assaying is more than two times as long as the magnetization inverted area at the center of the pinned layer, reproducing waveforms in the shapes as denoted by 42, 43-(1), and 44 are measured, and (2) when the width of the track used in assaying is less than two times as long as the magnetization inverted area at the center of the pinned layer, reproducing waveforms in the shapes as denoted by 42, 43-(2), and 44 are measured.

Figure 5:
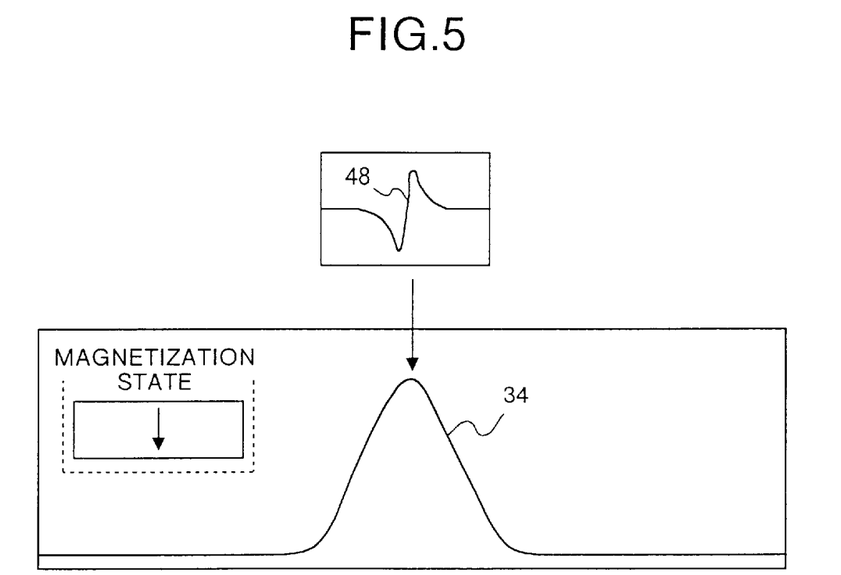
FIG. 5 is an explanatory view showing a track profile measured by the spin valve magnetoresistive effect type element assessment device according to the embodiment.

When the magnetization has been inverted entirely in the pinned layer, a track profile 34 having a single peak as shown in FIG. 5 is obtained, and a reproducing waveform having the identical shape with a reproducing waveform 48 is observed at each measuring position.

Figure 6:
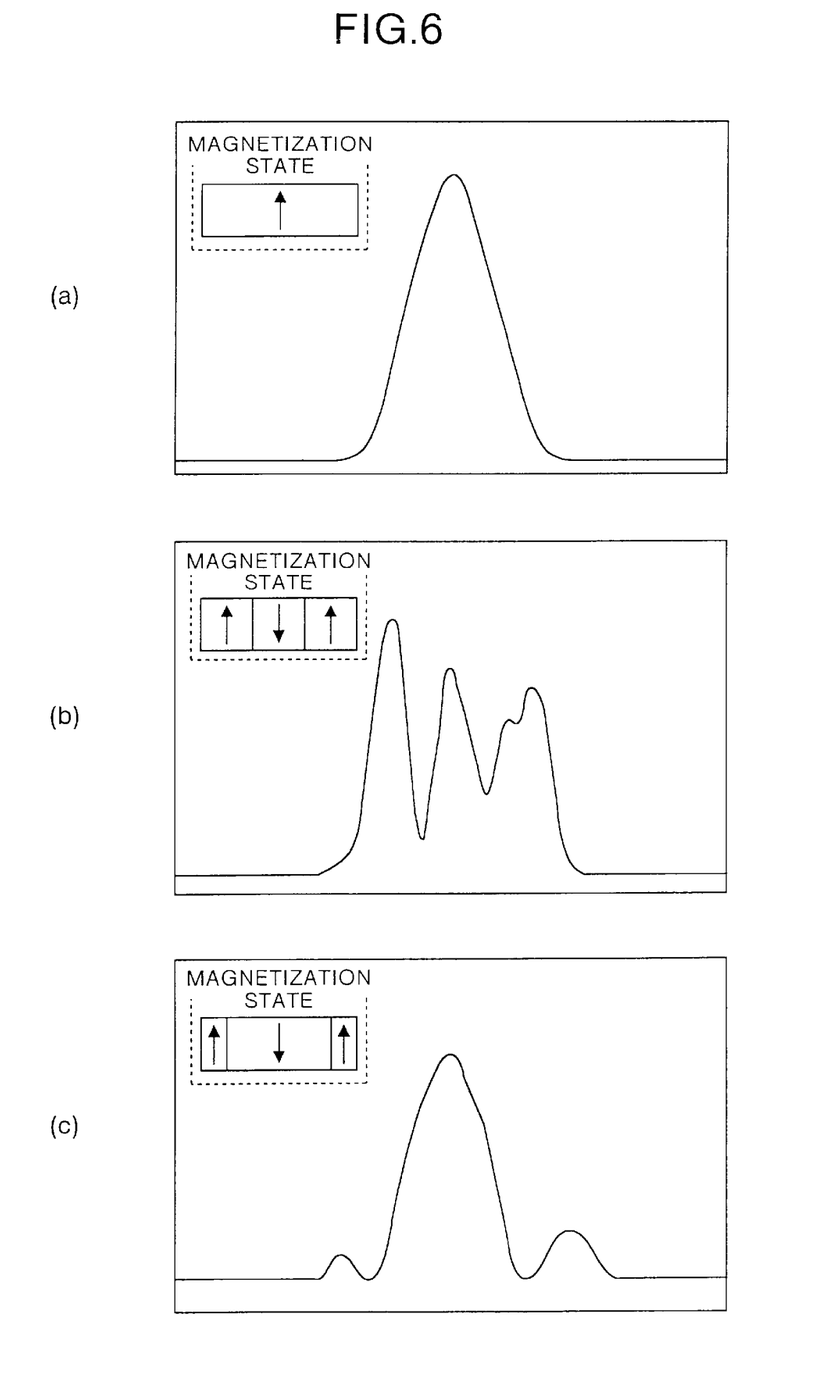
FIG. 6 is an explanatory view showing a track profile measured by the spin valve magnetoresistive effect type element assessment device according to the embodiment.

In addition, when effecting the measurement by using the track, in which magnetization information enabling observation of a solitary reproducing waveform is recorded, as shown in FIG. 6, track profiles of the identical shapes as those obtained when using the track for observing the dibit reproducing waveform are obtained for each magnetization state in the pinned layer.

When the present assessment device is actually used, the magnetization state in the pinned layer is assayed from the track profile thus obtained, and the PC 14 stores, as assaying data, simulation results of the SV element assessment device for a presumed magnetization state in the pinned layer in the SV element inside the SV head 21.

Figure 7:
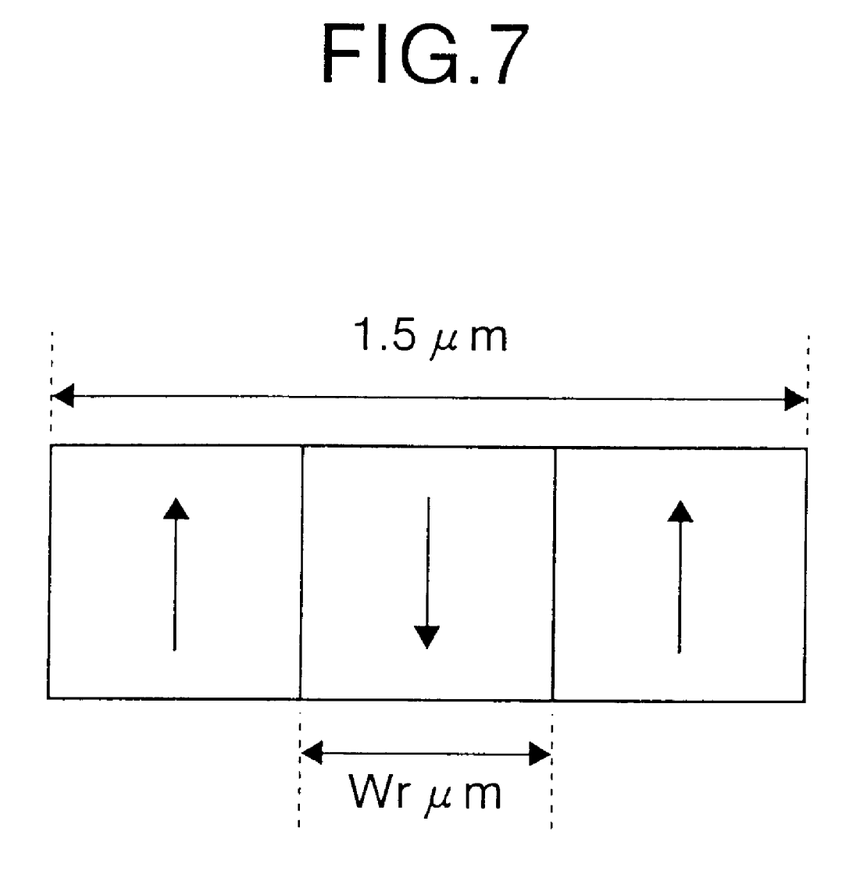
FIG. 7 is an explanatory view showing a presumed magnetization state in a pinned layer in a spin valve magnetoresistive effect type element for a simulation.
Figure 8:
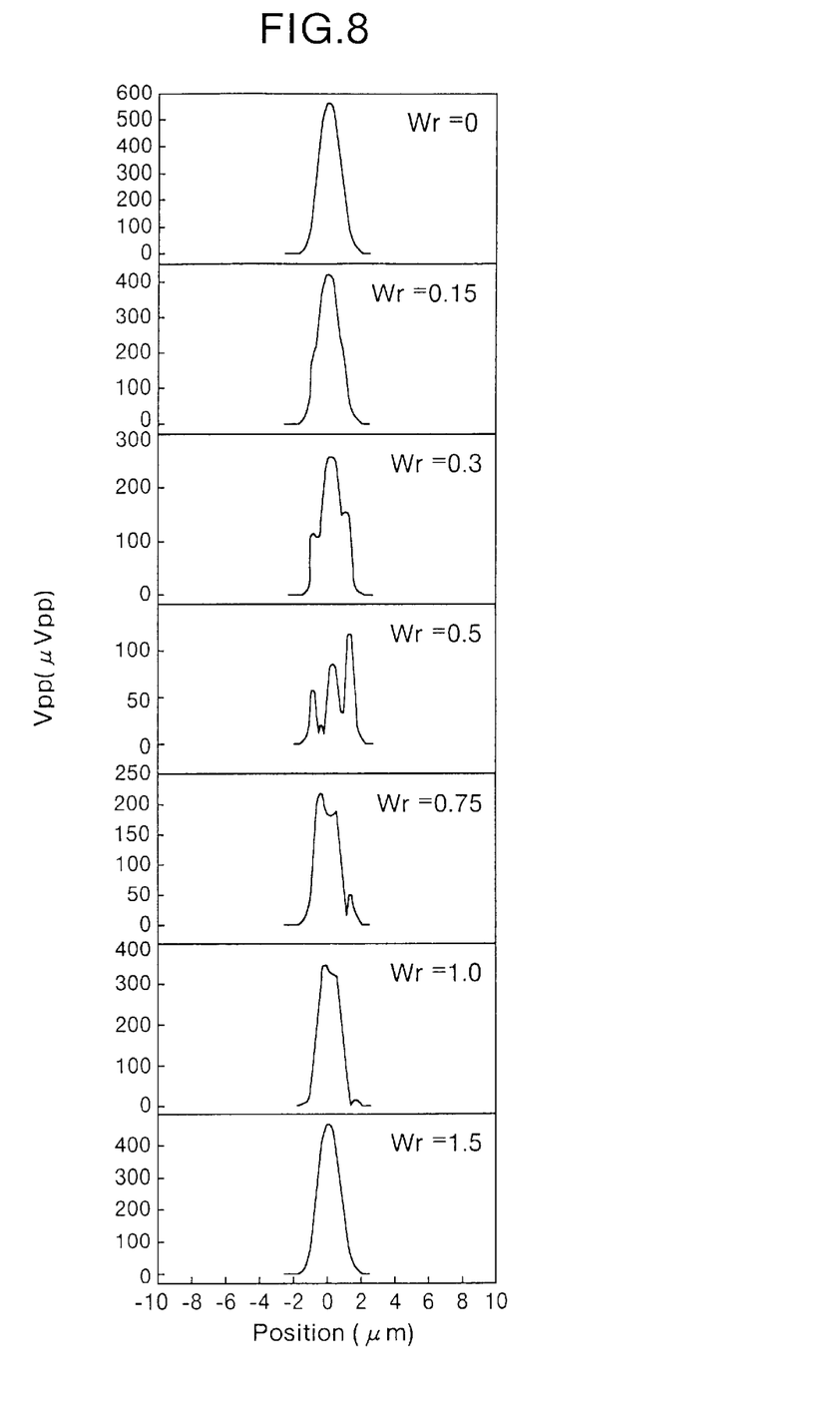
FIG. 8 is a view showing a simulation result when the length in a core axis direction of the spin valve magnetoresistive effect type element is longer than a width of an assaying track.
Figure 9:
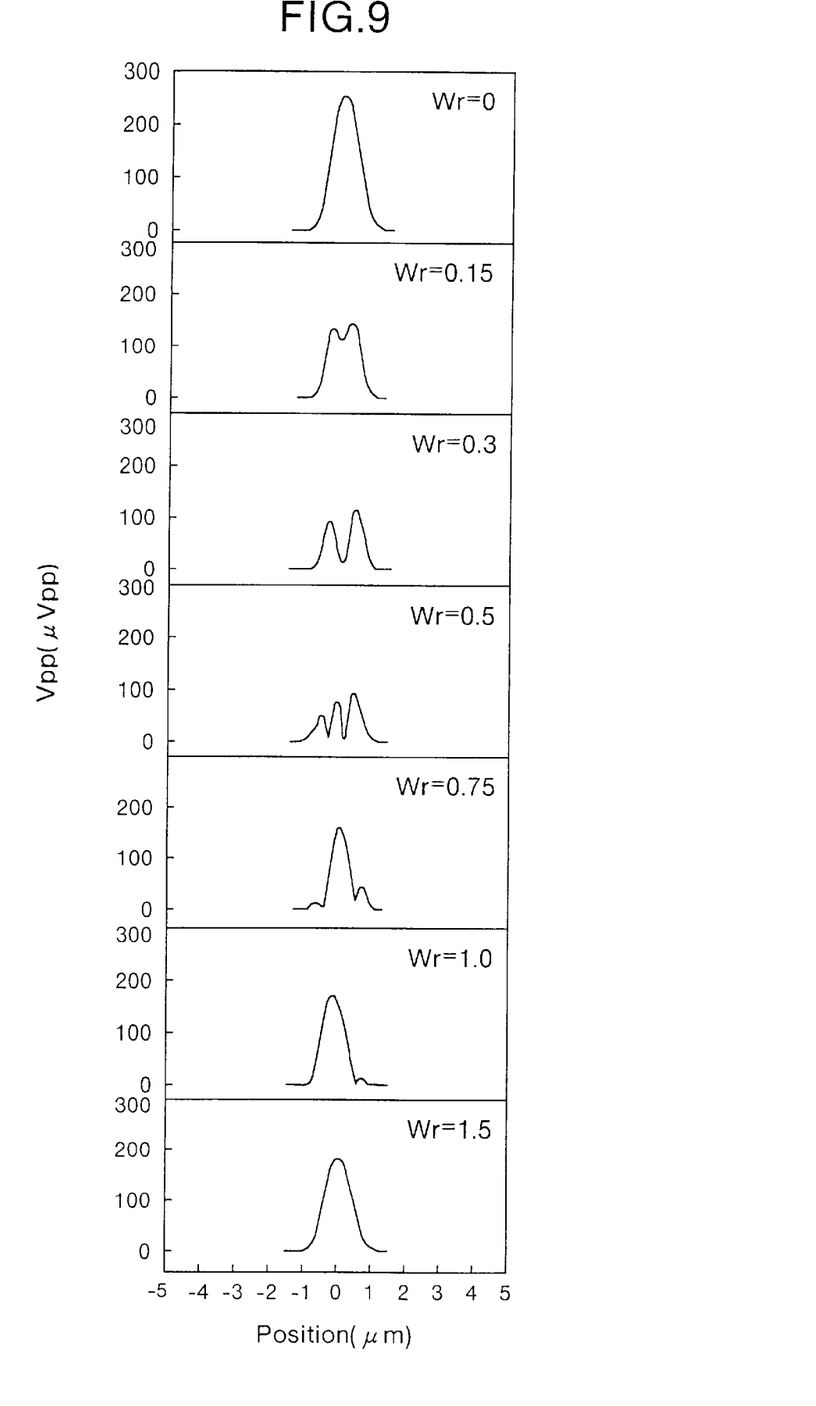
FIG. 9 is a view showing a simulation result when the length in a core axis direction of the spin valve magnetoresistive effect type element is shorter than a width of an assaying track.

More specifically, the PC 14 stores, on the assumption that the magnetization state in the pinned layer is the one schematically shown in FIG. 7, a simulation result (FIG. 8) in a case where the SV head having the read head core width of 1.2 $\mu$m is used for a track having a width of 0.4 $\mu$m, and a simulation result (FIG. 9) in a case where the same SV head is used for a track having a width of 1.5 $\mu$m, etc. By comparing the actually measured track profile with the simulation results, and by further carrying out a simulation when necessary, the user of the present assessment device specifies the magnetization state in the pinned layer (width and position of inverted magnetization).

As has been discussed, according to the spin valve magnetoresistive effect type element assessment method of the present invention, it is possible to assessment existence of an area in the pinned layer in the SV element where the magnetization has been inverted.

Also, by using the spin valve magnetoresistive effect type element assessment device of the present invention, it becomes possible to judge, before the magnetic head provided with the SV element is incorporated in the magnetic disk device, whether the magnetic head is normal or not, or the magnetic head has normal characteristics due to heat treatment in the magnetic field, etc. In addition, it becomes possible to effectively develop and conduct a study on a magnetic head that does not readily cause the magnetization inversion in the pinned layer in the SV element and a magnetic disk device.

INDUSTRIAL APPLICABILITY

The spin valve magnetoresistive effect type element assessment method and spin valve magnetoresistive effect type element assessment device of the present invention are useful in assaying the magnetization state in the pinned layer in the spin valve magnetoresistive effect type element, and in particular, in assaying the existence of an area in the pinned layer in the spin valve magnetoresistive effect type element where the magnetization has been inversed.

What is claimed is:

1. A spin valve magnetoresistive effect type element assessment method comprising the steps of:
   measuring a resistance value of a spin valve magnetoresistive effect type element is while a relative location correlation between said spin valve magnetoresistive effect type element and a magnetic field having a predetermined intensity distribution is adjusted; and
   assaying a magnetization state in a pinned layer in said spin valve magnetoresistive effect type element is based on a correlation between said relative location correlation and resistance value obtained in the measurement.

2. A spin valve magnetoresistive effect type element assessment device for assaying a magnetization state in a pinned layer in a spin valve magnetoresistive effect type element incorporated in a magnetic head, said device comprising:
   a magnetic disk having an assaying track, in which predetermined magnetic information is recorded;
   an actuator which maintains said magnetic head over said magnetic disk, said actuator also changes a distance between said magnetic head and a rotation center of said magnetic disk; and
   a position dependency data measuring and outputting unit which outputs position dependency data representing position dependency of a resistance value of said spin valve magnetoresistive effect type element by measuring the resistance value of said spin valve magnetoresistive effect type element while changing a position of said magnetic head in relation to said assaying track under control of said actuator.

3. The spin valve magnetoresistive effect type element assessment device according to claim 2, wherein said assaying track in said magnetic disk is a track having a width narrower than a core width of said spin valve magnetoresistive effect type element.

4. The spin valve magnetoresistive effect type element assessment device according to claim 2, further comprising:
   a time variation data measuring and outputting unit which measures the resistance value of said spin valve magnetoresistive effect type element, and outputs time variation data representing time variation associated with measuring.

5. The spin valve magnetoresistive effect type element assessment device according to claim 3, further comprising:
   a time variation data measuring and outputting unit which measures the resistance value of said spin valve magnetoresistive effect type element, and outputs time variation data representing time variation associated with measuring.

6. The spin valve magnetoresistive effect type element assessment device according to claim 4, wherein said assaying track is a track, in which magnetic information that makes a dibit reproducing waveform obtainable is recorded.

* * * * *

UNITED STATES PATENT AND TRADEMARK OFFICE
CERTIFICATE OF CORRECTION

PATENT NO. : 6,400,519 B2
DATED : June 4, 2002
INVENTOR(S) : Mukoyama

It is certified that error appears in the above-identified patent and that said Letters Patent is hereby corrected as shown below:

<u>Title page,</u>
Item [57], ABSTRACT,
Line 4, please delete "an oscilloscope for receiving" and insert -- an oscilloscope receives --
Line 6, please delete "for measuring" and insert -- measures --

<u>Column 7,</u>
Line 52, please delete "is"

<u>Column 8,</u>
Line 5, please delete "is"
Line 7, please insert -- said -- after "and"
Line 17, please delete "changes" and insert -- changing --

Signed and Sealed this

Eighteenth Day of March, 2003

JAMES E. ROGAN
*Director of the United States Patent and Trademark Office*